PARAMETRIC AMPLIFIER WITH SIGNAL CIRCUIT TUNING ONLY

Filed May 2, 1961

*INVENTOR,*
VICTOR BOXER
*BY* Jack H. Linscott
ATTORNEY.

United States Patent Office 3,120,644

Patented Feb. 4, 1964

3,120,644

PARAMETRIC AMPLIFIER WITH SIGNAL CIRCUIT TUNING ONLY

Victor Boxer, Belmar, N.J., assignor to the United States of America as represented by the Secretary of the Army Filed May 2, 1961, Ser. No. 107,273
3 Claims. (Cl. 330—4.9)
(Granted under Title 35, U.S. Code (1952), sec. 266)

The invention described herein may be manufactured and used by or for the Government for governmental purposes without the payment of any royalty thereon.

The present invention relates to a novel and useful solid state amplifier and more particularly to a parametric amplifier of the type in which a non-linear reactance is varied electrically by means of a pump signal in such a manner that signal energy applied to a tuned circuit which is coupled to said non-linear reactance is enhanced or amplified by virtue of the pumping action. This type of device has found extensive application as a low-noise amplifier at frequencies in the microwave region. The low-noise feature results from the fact that the active amplifying element, which may be a variable capacitance or inductance, requires no heater and therefore operates at room temperature or below.

The present invention is a parametric amplifier of the varactor diode type which is capable of amplifying signals below the UHF band and therefore employs signal circuits with lumped constants. By choosing the pumping and idler frequencies in the microwave region, it has been found that the amplifier may be tuned simply by altering the resonant frequency of the signal circuits only. In the embodiment of this invention disclosed herein, the alteration in the signal circuit frequency is accomplished by remotely controlled circuitry. Since the signal circuitry is composed of lumped reactance, it is easily tuned, and it is unnecessary to readjust the pump oscillator and idler tuned circuits when the signal frequency is changed.

It is therefore an object of this invention to provide a parametric amplifier which may be tuned to different signal frequencies without retuning the pump or idler circuits.

It is a further object of the invention to provide a varactor-type parametric amplifier in which the pump and idler circuits operate in the microwave region and the signal circuits at less than one hundred megacycles.

Other objects and advantages as well as additional features of this novel amplifier will become apparent from the following detailed description and drawing, in which—

Figure 1:
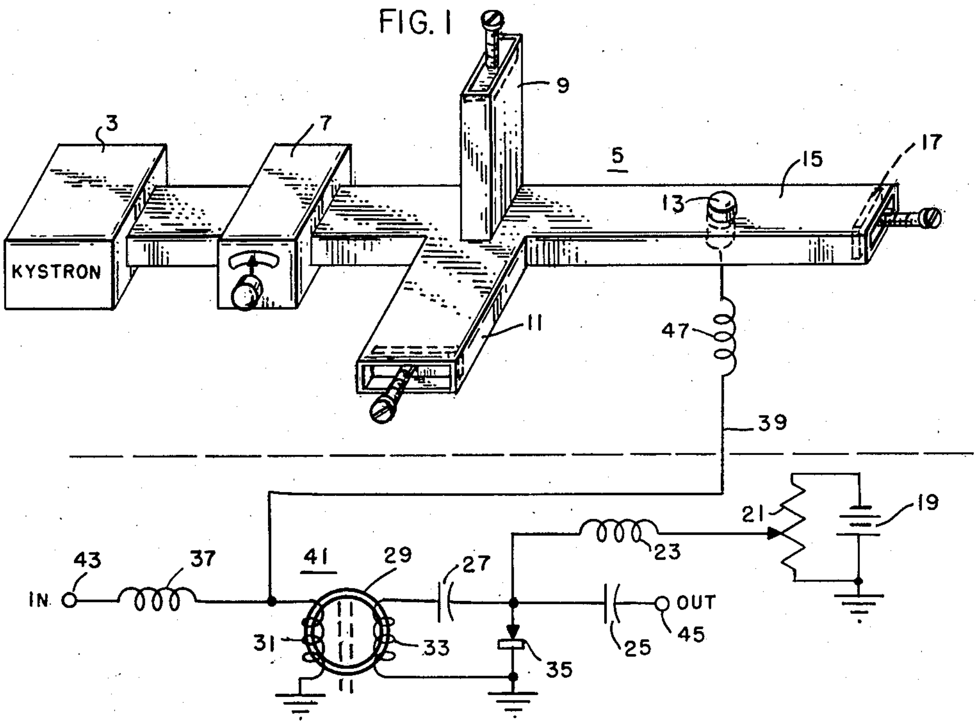
Figure 2:
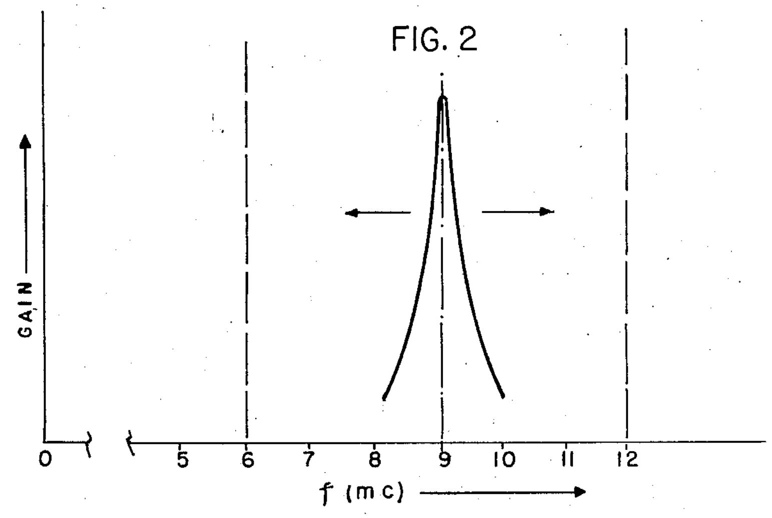

FIG. 1 is a schematic diagram of an amplifier which embodies the principles of the instant invention, and FIG. 2 is a graph illustrating the amplification characteristics of the circuit of FIG. 1.

The circuitry of FIG. 1 may be divided into two parts for purposes of explanation. The pump and idler circuitry, which operates in the microwave region, appears above the horizontal dashed line and the signal and tuning circuits, composed of lumped components, below the dashed line.

Pump power is supplied to the left hand end of X-band waveguide 5 from klystron oscillator 3 and applied to varactor diode 13 mounted within the guide. Input signals are applied to signal tuned circuit 41 via terminal 43 and the amplified signal is obtained at terminal 45. The right hand end of the waveguide, 15, comprises the idler tuned circuit. The X-band microwave energy applied to diode 13 varies the width of the depletion layer thereof in well-known fashion to modulate the effective capacity of the diode at a microwave rate. Diode 13 is coupled to tunable signal circuit 41 via choke 47 which confines the pump and idler energy to the waveguide. The interaction of the pumping and signal frequencies in diode 13 generates an idler frequency equal to the frequency difference between the pump and signal. The capacity variation of diode 13 results in an enhancement or amplification of the signal applied to tuned circuit 41. Since the signal frequency is very much smaller than the pump frequency the idler frequency will be very close to the pump frequency and the idler tank circuit may conveniently comprise an extension 15 of the X-band waveguide 5. The region 15 to the right of the diode 13 comprises a resonant cavity which may be tuned to the idler frequency by means of shorting plunger 17. The adjustable attenuator 7 and E-H tuner 9 and 11 control the amount of pump energy fed to diode 13 and provides the proper impedance match between the klystron oscillator and its load.

The tunable signal circuit 41 comprises a low loss, high permeability, toroidal ferrite core 29 on which are wound primary and secondary windings 31 and 33. The secondary circuit is tuned to resonance with the input signal by means of variable-capacity diode 35. The capacity and hence the resonant frequency of the tunable circuit 41 is controlled by varying the amount of D.C. reverse bias applied to diode 35 from adjustable voltage divider 21 which is connected across battery 19. RF choke 23 isolates the D.C. control circuit from the signal energy.

The RF choke 37 is chosen to have a substantial impedance at the signal frequency and therefore prevents the amplified signal voltages from leaking back toward input terminal 43, and also serves to isolate the input circuit from the pump and idler circuits.

In operation, the idler circuit 15 is adjusted by means of plunger 17 to resonate at a frequency equal to the pump frequency minus the mid-frequency of the tunable range of the signal circuit 41. For example, the pump frequency may be of the order of 10,000 mc. and the signal circuits may be designed to be tunable over a range of 6 to 12 mc. Since the mid-frequency of the signal circuits is 9 mc., the idler is tuned to 10,000—9=9991 mc. The idler will then be precisely adjusted to resonate at the difference between the pump and a 9 mc. signal applied to the amplifier, however a change of 3 mc. in the applied signal frequency, to either 6 or 12 mc., will result in only a small percentage change in idler frequency and the idler cavity can easily accommodate such a small frequency range without re-tuning. Thus no re-tuning of the microwave circuitry is required in order to tune the amplifier to different signal frequencies.

FIG. 2 shows a response curve of an amplifier which was constructed according to the teachings of this invention. The bandwidth of the response curve was of the order of 10 kc. at the half power points and was tunable over the range from 6 to 12 mc. by varying the remote voltage divider 21 of FIG. 1, as indicated by the vertical dashed lines in FIG. 2. The varactor used in this circuit was a type SC–70, made by Microwave Associates and the signal frequency tank circuits were wound on ½" diameter type Q2 "Ferramic" toroidal coils. This amplifier was experimentally used as a pre-selector or RF amplifier for a communications receiver and was found to yield stable, low-noise gain over a dynamic range of 90 db of input signal amplitudes. It is obvious that by varying the inductance of coils 31 and 33, other frequency ranges may be obtained.

The particular components and frequencies mentioned above are merely illustrative and should not be interpreted as limiting the invention. In general the pump frequency should be made at least 100 times the signal frequency in order that the idler frequency will not change appreciably, percentagewise, as the signal circuits are tuned over the desired range.

While a specific embodiment of the invention has been illustrated and described, the invention should not be limited thereto, but only by the scope of the appended claims.

What is claimed is:

1. A low-noise, narrow band, parametric amplifier comprising: a varactor diode; pump means coupled to said diode to vary its reactance at a microwave frequency, a tunable resonant circuit comprising lumped constant components coupled to said diode; means to apply an input signal, varying within a given frequency range, to said tunable resonant circuit and means for withdrawing the amplified signal frequency therefrom; said pump frequency being at least one hundred times said input signal frequency; and an idler circuit tuned to the difference of said pump frequency and the mid-frequency of said input signal frequency range.

2. The circuit of claim 1 wherein said tunable resonant circuit comprises a ferrite-cored transformer with a tuned secondary winding.

3. The circuit of claim 2 wherein said secondary winding is remotely tunable by means of a variable-capacity reverse biased diode.

References Cited in the file of this patent

UNITED STATES PATENTS

| | | |
|---|---|---|
| 2,936,369 | Lader | May 10, 1960 |
| 3,018,443 | Bloom et al. | Jan. 23, 1962 |

OTHER REFERENCES

Younger et al.: "Proceedings of the IRE," July 1959, pages 1271–1272.